United States Patent
Sukegawa et al.

(10) Patent No.: US 11,107,976 B2
(45) Date of Patent: Aug. 31, 2021

(54) MAGNETIC TUNNEL JUNCTION, SPINTRONICS DEVICE USING SAME, AND METHOD FOR MANUFACTURING MAGNETIC TUNNEL JUNCTION

(71) Applicant: NATIONAL INSTITUTE FOR MATERIALS SCIENCE, Tsukuba (JP)

(72) Inventors: Hiroaki Sukegawa, Tsukuba (JP); Ikhtiar, Tsukuba (JP); Shinya Kasai, Tsukuba (JP); Kazuhiro Hono, Tsukuba (JP); Xiandong Xu, Tsukuba (JP)

(73) Assignee: NATIONAL INSTITUTE FOR MATERIALS SCIENCE, Tsukuba (JP)

( * ) Notice: Subject to any disclaimer, the term of this patent is extended or adjusted under 35 U.S.C. 154(b) by 0 days.

(21) Appl. No.: 16/605,418

(22) PCT Filed: Jun. 8, 2018

(86) PCT No.: PCT/JP2018/022057
§ 371 (c)(1),
(2) Date: Oct. 15, 2019

(87) PCT Pub. No.: WO2018/230466
PCT Pub. Date: Dec. 20, 2018

(65) Prior Publication Data
US 2020/0044144 A1    Feb. 6, 2020

(30) Foreign Application Priority Data
Jun. 14, 2017    (JP) .............................. JP2017-116613

(51) Int. Cl.
*H01L 43/02*    (2006.01)
*H01L 27/22*    (2006.01)
(Continued)

(52) U.S. Cl.
CPC ............ *H01L 43/02* (2013.01); *G11B 5/3909* (2013.01); *G11C 11/161* (2013.01);
(Continued)

(58) Field of Classification Search
CPC ....... H01L 43/02; H01L 27/226; H01L 43/10; H01L 43/12; H01L 21/8239;
(Continued)

(56) References Cited

U.S. PATENT DOCUMENTS

| 8,680,633 B1 * | 3/2014 | Kato ....................... H01L 43/10 257/425 |
| 2010/0073827 A1 * | 3/2010 | Zhao .................... G11B 5/3909 360/324.2 |

(Continued)

FOREIGN PATENT DOCUMENTS

| JP | 2003-229614 A | 8/2003 |
| JP | 2013-175615 A | 9/2013 |

(Continued)

OTHER PUBLICATIONS

Japanese Office Action dated Sep. 14, 2020 in Japanese Patent Application No. 2019-525389 (with unedited computer generated English translation), 8 pages.

(Continued)

*Primary Examiner* — Ahmed N Sefer
(74) *Attorney, Agent, or Firm* — Oblon, McClelland, Maier & Neustadt, L.L.P.

(57) ABSTRACT

According to an embodiment, a magnetic tunnel junction includes a tunnel barrier layer provided between a first magnetic layer and a second magnetic layer. The tunnel barrier layer is a crystal body made of a stacked structure of a first insulating layer and a second insulating layer. The crystal body is oriented. The first insulating layer is made of an oxide of $Mg_{1-x}X_x$ ($0 \leq x \leq 0.15$). X includes at least one (Continued)

element selected from the group consisting of Al and Ti. The second insulating layer is made of an oxide of an alloy including at least two elements selected from the group consisting of Mg, Al, Zn, and Li. Both the first magnetic layer and the second magnetic layer are made of an alloy including B and at least one element selected from the group consisting of Co and Fe.

14 Claims, 10 Drawing Sheets

(51) Int. Cl.
| | | |
|---|---|---|
| *H01L 43/10* | (2006.01) | |
| *H01L 43/12* | (2006.01) | |
| *H01L 43/08* | (2006.01) | |
| *H01L 21/8239* | (2006.01) | |
| *G11C 11/16* | (2006.01) | |
| *G11B 5/39* | (2006.01) | |
| *H01L 27/105* | (2006.01) | |

(52) U.S. Cl.
CPC ........ *H01L 21/8239* (2013.01); *H01L 27/105* (2013.01); *H01L 27/226* (2013.01); *H01L 43/08* (2013.01); *H01L 43/10* (2013.01); *H01L 43/12* (2013.01)

(58) Field of Classification Search
CPC ..... H01L 27/105; H01L 43/08; G01R 33/098; G11C 11/161; G11B 5/3909
See application file for complete search history.

(56) References Cited

U.S. PATENT DOCUMENTS

| | | | |
|---|---|---|---|
| 2012/0091548 A1 | 4/2012 | Sukegawa et al. | |
| 2013/0221461 A1* | 8/2013 | Sukegawa | H01L 43/08 257/421 |
| 2014/0284592 A1* | 9/2014 | Nagamine | H01F 41/307 257/43 |
| 2015/0137287 A1* | 5/2015 | Kim | H01L 43/02 257/421 |
| 2016/0260890 A1* | 9/2016 | Guo | H01L 43/10 |
| 2016/0380184 A1* | 12/2016 | Kato | H01L 27/228 257/421 |
| 2016/0380185 A1* | 12/2016 | Kato | H01L 27/228 257/421 |
| 2016/0380186 A1* | 12/2016 | Daibou | H01L 43/08 257/421 |
| 2017/0179374 A1* | 6/2017 | Omine | H01L 43/08 |
| 2019/0137576 A1 | 5/2019 | Sasaki | |

FOREIGN PATENT DOCUMENTS

| | | |
|---|---|---|
| JP | 5586028 B2 | 9/2014 |
| JP | 2015-176933 A | 10/2015 |
| JP | 5988019 B2 | 9/2016 |
| JP | 2017-41606 A | 2/2017 |
| JP | 6103123 B1 | 3/2017 |

OTHER PUBLICATIONS

International Search Report dated Jul. 24, 2018 in PCT/JP2018/022057 filed Jun. 8, 2018.
David D. Djayaprawira, et al., "230% room-temperature magnetoresistance in CoFeB/MgO/CoFeB magnetic tunnel junctions," Applied Physics Letters, vol. 86, 092502, Feb. 2005, 4 Pages.
Masakiyo Tsunoda, et al., "Fabrication of $MgAl_2O_4$ tunnel barrier by radio frequency-sputtering method and magnetoresistance effect through it with Fe or $Fe_4N$ ferromagnetic electrode," Journal of Applied Physics, vol. 117, 17D703, 2015, 4 Pages.
Houfang Liu, et al., "Tunnel Magnetoresistance Effect in CoFeB/$MgAlO_x$/CoFeB Magnetic Tunnel Junctions," IEEE Transactions on Magnetics, vol. 47, No. 10, Oct. 2011, pp. 2716-2719.

* cited by examiner

MAGNETIC TUNNEL JUNCTION, SPINTRONICS DEVICE USING SAME, AND METHOD FOR MANUFACTURING MAGNETIC TUNNEL JUNCTION

TECHNICAL FIELD

An embodiment of the invention relates to a magnetic tunnel junction, a spintronics device (a magneto-resistance effect element and a magnetic memory device) using the magnetic tunnel junction, and a method for manufacturing a magnetic tunnel junction.

BACKGROUND ART

A magnetic tunnel junction (MTJ) that is made of a three-layer structure of a ferromagnetic layer/insulator layer (barrier layer)/ferromagnetic layer is used as, for example, the magnetic head of a hard disk device or the information recording cell of nonvolatile random access memory (MRAM: Magneto-resistive random access memory). Also, utilization is possible as a compact highly-sensitive magnetic sensor. A MTJ element has a tunnel magneto-resistance effect (TMR: Tunnel magneto-resistance) in which the tunnel resistance value changes via a barrier layer according to the relative magnetization angles of two ferromagnetic layers. In such a field of application, it is desirable to have a high magneto-resistance change ratio (TMR ratio), to be easy to make, and to be makeable on a wide range of substrates.

A MTJ element that is made of cobalt-iron-boron (CoFeB) as a ferromagnetic layer and magnesium oxide (MgO) as a barrier layer is widely used. The major reason thereof is because CoFeB is amorphous; therefore, there are favorable features for a wide range of element applications such as a high TMR ratio exceeding 100% being obtained relatively easily at room temperature, a MTJ element structure being directly makeable on a wide range of underlayer structures, etc. Especially, the high TMR ratio is caused by the crystallization of the CoFeB layer progressing from the MgO barrier layer. A film of MgO that is formed on the amorphous CoFeB layer by using sputtering, etc., is obtained as a layer having (001) orientation-growth; crystallization of the CoFeB layer progresses from the MgO layer-side interface due to heat treatment at about 200 to 500° C.; and as a result, a high-quality interface crystal structure is realized. Therefore, in the MTJ element that has a CoFeB/MgO/CoFeB structure, a stacked structure in which all three layers have the (001) crystal orientation is realized by the heat treatment; therefore, a large increase of the TMR ratio is observed (Non-Patent Literature 1). The high TMR ratio is due to a coherent tunneling effect via the $\Delta_1$-band of the MgO (001).

On the other hand, because there is lattice mismatch of about 3 to 4% between MgO and CoFeB, there is a problem in which many misfit dislocation defects are introduced at the interface of MgO and CoFeB. Therefore, there is a limit to improving the TMR ratio in a CoFeB/MgO/CoFeB structure. Also, generally, the lattice mismatch is even larger between MgO and the material group other than CoFeB for which there are expectations of utilization as the ferromagnetic layer. For example, because of the large lattice mismatch of 3 to 6% for a Co-based Heusler alloy such as $Co_2FeAl$, $Co_2MnSi$, etc., which are high spin polarization materials and 8 to 10% for FePt, MnGa, etc., which are perpendicular magnetization materials, it is difficult to make a MTJ element having a pronounced coherent tunneling effect by using these ferromagnetic layers with MgO as the barrier layer.

As a method for making a higher-quality MTJ element by reducing such a large lattice mismatch, there is a method of using $MgAl_2O_4$ as the barrier layer (Patent Literature 1). $MgAl_2O_4$ has a spinel structure having a lattice constant of about 0.809 nm as a stable structure. The crystal lattice spacing has good lattice matching with a wide range of ferromagnets such as CoFeB, CoFe, Co-based Heusler alloys, FePt, CoPt, MnGa, MnGe, etc., because the crystal lattice spacing is about 4% smaller than MgO which has a rock-salt structure. Also, it is possible to obtain a structure in which the cation sites of a spinel structure are arranged randomly (a cation-disordered spinel structure) as a meta-stable structure (Patent Literature 2). Furthermore, for $MgAl_2O_4$, it is unnecessary for the ratio of Mg and Al to be 1:2 which is the stoichiometric ratio; the lattice constant can be changed continuously by adjusting the ratio of Mg and Al; therefore, the lattice matching with the ferromagnetic layer can be increased further. Therefore, a more general representation of $MgAl_2O_4$ can be written as $(Mg_{1-x}Al)$—$O_x$ (0<x<1). In the case where a $MgAl_2O_4$ barrier layer is used as well, the coherent effect arises; and a large TMR ratio exceeding 300% at room temperature is realized (Patent Literature 2). Also, a problem is known in which the TMR ratio decreases due to the application of a bias voltage in a MTJ element; and this is a practical problem (bias voltage dependence). It is also known that the degree of the decrease of the TMR ratio can be reduced if the lattice mismatch is reduced by introducing the $MgAl_2O_4$ barrier layer (Patent Literature 1). Furthermore, it is known that a strong perpendicular magnetic anisotropy can be introduced to an extremely thin ferromagnetic layer contacting $MgAl_2O$; and due to this effect, a perpendicular magnetization MTJ element that is suited to increasing the capacity of MRAM can be configured (Patent Literature 3).

However, it is necessary to obtain a crystalline $MgAl_2O_4$ barrier layer to make a high performance MTJ element having a high room temperature TMR ratio, good bias voltage characteristics, etc.; and to this end, an underlayer structure of a single-crystal ferromagnetic layer, e.g., Fe, CoFe alloys, or a $Co_2FeAl$ alloy was necessary. Therefore, there were problems in applications such as the utilizable substrates and underlayer materials being extremely limited. Especially, there was a problem in which an amorphous $MgAl_2O_4$ layer is obtained if the $MgAl_2O_4$ layer is formed on amorphous CoFeB; therefore, the crystallization of the MTJ element cannot be realized; therefore, the coherent tunneling effect is not obtained; and a high TMR ratio such as a TMR ratio exceeding 100% cannot be realized using the CoFeB layer and the $MgAl_2O_4$ barrier layer (Non-Patent Literature 2 and Non-Patent Literature 3).

PRIOR ART DOCUMENTS

Patent Literature

Patent Literature 1: Japanese Patent No. 5586028
Patent Literature 2: Japanese Patent No. 5988019
Patent Literature 3: JP-A 2017-041606 (Kokai)

Non-Patent Literature

Non-Patent Literature 1: D. D. Djayaprawira, K. Tsunekawa, M. Nagai, H. Maehara, S. Yamagata, N. Watanabe, S. Yuasa, Y. Suzuki, and K. Ando, Appl. Phys. Lett., Vol. 86, p. 092502 (2005).

Non-Patent Literature 2: M. Tsunoda, R. Chiba, and K. Kabara, J. Appl. Phys., Vol. 117, p. 17D703 (2015).

Non-Patent Literature 3: H. Liu, Q. Ma, S. Rizwan, D. Liu, S. Wang, and X. Han, IEEE Trans. Magn., Vol. 47, p. 2716 (2011).

SUMMARY OF INVENTION

Problem to be Solved by the Invention

Considering such an actual situation, the invention is directed to achieve a high TMR ratio by realizing a MTJ element including a CoFeB layer and a $MgAl_2O_4$ barrier layer without using a conventional single-crystal underlayer. It is also directed to suppress the bias voltage dependence of the TMR ratio.

Means for Solving the Problem

In the process of research relating to a MTJ element using $MgAl_2O_4$ as a barrier layer, the inventors discovered that by forming a $MgAl_2O_4$ film after forming extremely thin MgO on a CoFeB layer, crystallization of the $MgAl_2O_4$ layer occurs; and a $MgO/MgAl_2O_4$ stacked film is obtained as an oriented film having (001) growth. As a result, the inventors discovered that all of the layers of the stacked film made of the $CoFeB/MgO/MgAl_2O_4/CoFeB$ structure are crystallized by heat treatment so that the stacked film functions as a MTJ element realizing a high TMR ratio. Simultaneously, the discovery that the bias voltage dependence is improved by the effect of the $MgO/MgAl_2O_4$ stacked barrier layer having a small lattice mismatch with CoFeB also led to the invention.

[1]
A magnetic tunnel junction including a tunnel barrier layer provided between a first magnetic layer and a second magnetic layer, the tunnel barrier layer being a crystal body made of a stacked structure of a first insulating layer and a second insulating layer, the crystal body being oriented, the first insulating layer being made of an oxide of $Mg_{1-x}X_x$ ($0 \leq x \leq 0.15$), X including at least one element selected from the group consisting of Al and Ti, the second insulating layer being made of an oxide of an alloy including at least two elements selected from the group consisting of Mg, Al, Zn, and Li, both the first magnetic layer and the second magnetic layer being made of an alloy including B and at least one element selected from the group consisting of Co and Fe.

[2]
The magnetic tunnel junction according to [1], wherein a layer including at least one element selected from the group consisting of Co and Fe is further provided at both or one of between the tunnel barrier layer and the first magnetic layer or between the tunnel barrier layer and the second magnetic layer.

[3]
The magnetic tunnel junction according to [1] or [2], wherein the first insulating layer is made of MgO.

[4]
The tunnel junction according to any one of [1] to [3], wherein the second insulating layer is made of an oxide of $Mg_{1-y}Al_y$ ($0.2 \leq y \leq 0.8$).

[5]
The magnetic tunnel junction according to any one of [1] to [4], having a tunnel magneto-resistance not less than 120% and not more than 34000% at room temperature.

[6]
A spintronics device, comprising the magnetic tunnel junction according to any one of [1] to [5].

[7]
The spintronics device according to [6], wherein the spintronics device is one of a hard disk magnetic head, a spin torque rewritable MRAM (a STT-MRAM), a three-terminal MRAM, a voltage-driven MRAM, a spin torque oscillator, or a spin resonance tunnel element.

[8]
A method for manufacturing a magnetic tunnel junction, comprising: a process of introducing a substrate (e.g., Si) to a sputtering apparatus; a process of forming a first magnetic layer (e.g., a Co—Fe—B layer); a process of forming a first insulating layer (e.g., a MgO film) to overlap the first magnetic layer; a process of forming a second insulating layer (e.g., a Mg—Al—O layer) to overlap the first insulating layer; a process of forming a second magnetic layer (e.g., a $Co_{20}Fe_{60}B_{20}$ layer) to overlap the second insulating layer; and a process of performing heat treatment of a multilayer film structure that is made, the heat treatment being performed in a vacuum for 1 minute to 60 minutes at a temperature range from 300° C. to 500° C.

[9]
The method for manufacturing the magnetic tunnel junction according to [8], wherein the first magnetic layer formation process is performed after forming an underlayer structure film (e.g., Ta) at the substrate.

[10]
The method for manufacturing the magnetic tunnel junction according to [8] or [9], wherein a process of forming a second magnetic insertion layer (e.g., a CoFe film) to overlap the first magnetic layer is performed between the first magnetic layer formation process and the first insulating layer formation process.

[11]
The method for manufacturing the magnetic tunnel junction according to any one of [8] to [10], wherein a process of forming a second magnetic insertion layer (e.g., a CoFe film) to overlap the second insulating layer is performed between the second insulating layer formation process and the second magnetic layer formation process.

[12]
The method for manufacturing the magnetic tunnel junction according to any one of [8] to [11], wherein a process of forming an upper structure film (e.g., Ta) to overlap the second magnetic layer is performed between the second magnetic layer formation process and the heat treatment process.

Effects of the Invention

In the invention, a barrier layer that is made of Mg—Al—O having a small lattice mismatch with CoFeB is provided; and as a result, for example, a MTJ element in which a large TMR ratio is obtained and a method for making the MTJ element are provided. Here, a large TMR ratio is the obtainment of a TMR ratio of 120% or more at room temperature. Also, the bias voltage dependence of the TMR ratio can be improved; and when a bias voltage $V_{half}$ at which the TMR ratio is halved is used as an indicator of the bias voltage dependence, a value exceeding $V_{half}=1$ V can be realized. Therefore, it is possible to improve the electrical output of the MTJ element. The MTJ element of the invention not only is applicable to a hard disk magnetic head and a spin torque rewritable MRAM (a STT-MRAM), but also can be utilized in many spintronics devices such as a three-terminal MRAM, a voltage-driven MRAM, a spin torque oscillator, a spin resonance tunnel element, etc.

MODES FOR CARRYING OUT THE INVENTION

The tunnel barrier of the embodiment and embodiments of MTJ elements using the tunnel barrier will now be described with reference to FIG. 1A, FIG. 1B, FIG. 2A, and FIG. 2B.

The MTJ element of the embodiment is an element in which a first magnetic layer, a first insulating layer, a second insulating layer, and a second magnetic layer are stacked in this order on a substrate. The first insulating layer and the second insulating layer are made of oxides. As an example, the first magnetic layer and the second magnetic layer are made of CoFeB; and the first insulating layer and the second insulating layer respectively have MgO and MgAl$_2$O$_4$ as major bodies.

In such a case, it is unnecessary for the Mg:Al ratio of MgAl$_2$O$_4$ to be 1:2 in the second insulating layer; and compositions having a wide range of ratios can be used (hereinafter, recited using the general notation of Mg—Al—O). Also, both a spinel structure and a cation-disordered spinel structure can be used as the crystal structure of Mg—Al—O. Also, other than Mg and Al, the elements that form the spinel structure may include, for example, an oxide including Li and Zn. Also, other than MgO, the first insulating layer may have a stacked structure of a metal Mg layer/MgO layer or a structure including a small amount of Al or Ti. Also, the effects also are realized in a structure in which a CoFe alloy is inserted between the first magnetic layer and the first insulating layer and/or between the second magnetic layer and the second insulating layer.

First Embodiment

Figure 1A:
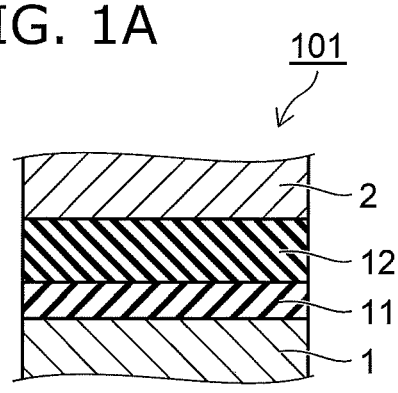
FIGS. 1A and B are schematic cross-sectional views of a magnetic tunnel junction (MTJ) element film according to one embodiment of the invention.

A MTJ film first embodiment 101 which is the basic structure of a first embodiment is shown in FIG. 1A. The MTJ film first embodiment 101 has a multilayer film structure; and a first magnetic layer 1, a first insulating layer 11, a second insulating layer 12, and a second magnetic layer 2 are stacked in order from the bottom. Either of the first magnetic layer 1 and the second magnetic layer 2 may be a fixed magnetic layer or a free magnetic layer. Also, the magnetization direction may be either a film in-plane direction or a film out-of-plane direction. The fabrication method and the effects of the structure of the MTJ film first embodiment 101 will now be described.

The first magnetic layer 1 is, for example, a layer made of Co—Fe—B formed by physical vapor deposition such as sputtering, vapor deposition, etc. The Co—Fe—B has an amorphous structure at this stage. It is sufficient for the composition of Co and Fe to be Co$_{1-n}$Fe$_n$ (0≤n≤1); and the composition of Co and Fe is a composition that includes CoB and FeB. It is sufficient for the B composition inside Co—Fe—B to be in a range in which the Co—Fe—B layer is ferromagnetic and amorphous; and the B composition in Co—Fe—B is, for example, about 15 to 25 atomic %. The thickness of this layer is, for example, 0.8 to 5 nm but is determined to be in balance with the lower layer structure of the first magnetic layer 1. Also, this layer also can be obtained as a layer having perpendicular magnetization by setting this layer to be extremely thin with a thickness of not more than about 1.5 nm.

Then, the first insulating layer 11 is a layer made of an oxide having MgO as a major body. The oxygen amount may be somewhat deficient or excessive; and effects are obtained in the range of MgO$_{1+\delta}$ (−0.2≤δ≤0.2). This layer can be utilized because this layer is obtained as a crystal layer even if Al or Ti is included at about 15 atomic % with respect to Mg. Also, the first insulating layer 11 has the effect of promoting the crystallization of the second insulating layer 12 formed on the first insulating layer 11 and is a crystal film having substantially (001) growth, but may partially include amorphous and/or polycrystalline bodies at this stage. To control the crystal structure of the first insulating layer 11, for example, heat treatment in a vacuum at a range of about 100 to 400° C. also can be performed after the formation of this layer.

Then, the second insulating layer 12 is formed on the first insulating layer 11. The second insulating layer 12 is a hybrid oxide layer having Mg—Al—O as a major component. This layer can have a cubic crystal body. Also, the composition is such that a spinel structure is the stable structure. $Mg_{1-y}Al_y$ (0.2≤y≤0.8) can be used as the composition of Mg and Al. Here, y is set to be 0.2 or more to obtain the effect of improving $v_{half}$ because the lattice mismatch between the first magnetic body 1 and the second magnetic body 2 can be reduced to be about 3% or less. Also, y is set to be 0.8 or less because the crystallization of Mg—Al—O becomes difficult due to the effect of the Al-rich composition. Also, the effects are obtained even if the oxygen amount of this layer is deficient or excessive with respect to the stoichiometric composition; for example, as a general formula, a range of $Mg_{1-x}Al_xO_{1.5-x/2+\delta'}$ (−0.2≤δ'≤0.2) can be utilized. Also, a portion of Mg and Al may be replaced with Zn and Li with the object of stabilizing the spinel structure, adjusting the insulative characteristics and the element resistance, and/or improving the TMR ratio. This is because the Al oxides of $ZnAl_2O_4$ and $LiAl_{2.5}O_4$ that include Zn and Li are insulating bodies having spinel structure crystals having about the same lattice constant as $MgAl_2O_4$. The effects of the embodiment are realized even if Zn and Li are included because a solid solution that is continuous with $MgAl_2O_4$ can be made due to the feature of these material properties being similar. Also, to control the crystal structure of the second insulating layer 12, for example, heat treatment in a vacuum at the range of 100 to 400° C. also can be performed after the formation of this layer.

Various known methods can be used to make the first insulating layer 11 and the second insulating layer 12. For example, high frequency sputtering from a target material made of an oxide, reactive vapor deposition or reactive sputtering using an oxygen gas, a method of oxidizing after forming a metal layer made of an alloy of Mg or $Mg_{1-a}Al_a$ (0<a≤1) (post oxidation), multistep post oxidation, or a technique in which these techniques are combined can be used. These techniques may be performed while heating the substrate at a temperature in a range that does not degrade the flatness.

For example, the range of 0.05 to 1.2 nm is favorable as the thickness of the first insulating layer 11. 0.1 to 1.0 nm is more favorable. 0.2 to 0.8 nm is more favorable. 0.05 nm corresponds to the thickness of about ¼ of one atomic plane of MgO (001); and this thickness or more can function as a crystal template for obtaining the second insulating layer 12 as a crystal layer. As the first insulating layer 11 film thickness increases, the crystal template effect improves; and the crystallization of the second insulating layer 12 can be realized at a lower heat treatment temperature. On the other hand, because there is lattice mismatch of about 4% between MgO and Co—Fe—B, thoughtlessly increasing the first insulating layer 11 film thickness causes the effects of the lattice mismatch between the first magnetic layer 1 and the first insulating layer 11 to increase; therefore, there is a risk that $V_{half}$ may decrease.

Although the thickness is not limited in terms of crystallizing the second insulating layer 12, to provide a practical resistance area (resistance R×area A; the RA value) as the MTJ element, it is favorable for the thickness to be 3 nm or less; and it is more favorable for the thickness to be 2 nm or less. To effectively reduce the lattice mismatch between the first magnetic layer 1 and the stacked insulating layer and between the second magnetic layer 2 and the stacked insulating layer and to obtain a high $V_{half}$, it is favorable for the second insulating layer 12 film thickness to be equal to or greater than the first insulating layer 11 layer thickness. Taking into account the description recited above, for the object of the MTJ element, it is favorable for the total thickness of the stacked film of the first insulating layer and the second insulating layer to be 0.6 nm to 3 nm.

Also, the control of the interface crystal structure and/or the adjustment of the perpendicular magnetic anisotropy also can be performed by inserting an extremely thin metal film made of $Mg_{1-b}Al_b$ (0≤b≤1) and having a thickness of, for example, 1 nm or less between the first magnetic layer 1 and the first insulating layer 11 and/or between the second insulating layer 12 and the second magnetic layer 2.

Then, the second magnetic layer 2 is formed on the second insulating layer 12. Similarly to the first magnetic layer 1, the second magnetic layer 2 also is a layer having an amorphous structure and having Co—Fe—B as a major body. The same technique as the first magnetic layer 1 can be used as the method for making the layer.

After forming the multilayer film structure recited above, for example, by performing heat treatment in a vacuum for 1 minute to 60 minutes at a temperature range of about 200 to 500° C., the structure changes to a cubic structure as an entirety; and a crystal multilayer film that has substantially the (001) orientation is formed. By adjusting the heat treatment conditions, mutual atomic diffusion can be promoted partially or as an entirety in the first insulating layer 11 and the second insulating layer 12; and one body of a Mg—Al—O barrier layer also can be obtained. Due to this effect, it is possible to obtain a Co—Fe—B/Mg—Al—O/Co—Fe—B stacked structure having good lattice matching; and a higher $V_{half}$ can be obtained while realizing a high TMR ratio equal to that of a known single-layer MgO barrier element. For example, according to the invention, a magnetic tunnel junction that has a tunnel magneto-resistance not less than 120% and not more than 34000% at room temperature is made.

Second Embodiment

Figure 1B:
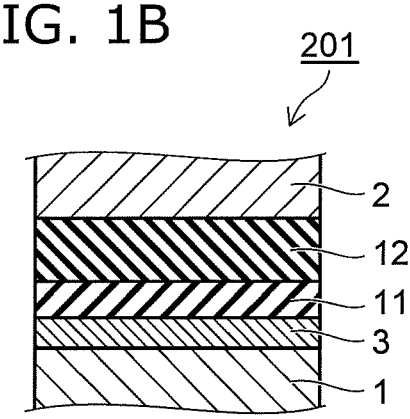

A second embodiment is shown as a MTJ film second embodiment 201 in FIG. 1B and will now be described. The MTJ film second embodiment 201 is the MTJ film first embodiment 101 in which a magnetic insertion layer 3 is newly provided between the first magnetic layer 1 and the first insulating layer 11. Otherwise, a structure, a composition, and a manufacturing method equivalent to those of the MTJ film first embodiment 101 can be used. The magnetic insertion layer 3 is a thin insertion layer made of $Co_{1-m}Fe_m$ (0<m≤1). The magnetic insertion layer 3 has the effect of promoting the crystallization of both the first insulating layer 11 and the second insulating layer 12, and causes the improvement of the TMR ratio. It is favorable for the film thickness of this layer to be thinner than the first magnetic layer 1, e.g., 0.1 to 1.5 nm. The magnetic insertion layer 3 can be made using the same technique as Co—Fe—B such as sputtering, vacuum vapor deposition, etc. To improve the flatness of the magnetic insertion layer 3, heat treatment may be performed in a vacuum at a temperature of 100 to 300° C. Also, a CoFe alloy layer may be inserted using a technique similar to that of the magnetic insertion layer 3 also between the second insulating layer 12 and the second magnetic layer 2.

Third Embodiment

Figure 2A:
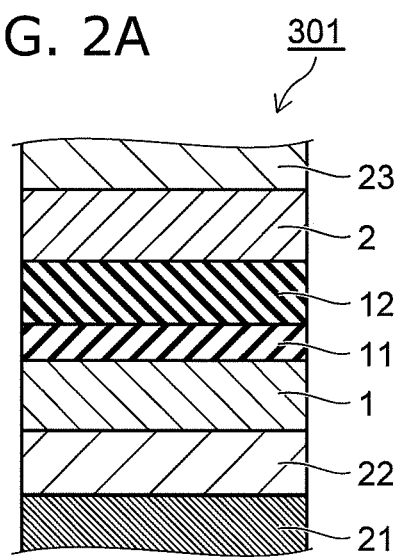
FIGS. 2A and B are schematic cross-sectional views of other examples of MTJ element films according to one embodiment of the invention.

As shown typically as a MTJ film third embodiment 301 in FIG. 2A, a third embodiment is the MTJ film first embodiment 101 in which a lower structure of the first magnetic layer 1 and an upper structure of the second magnetic layer 2 are newly provided. First, a substrate 21 is provided; and an underlayer structure layer 22 is provided on the substrate 21. The MTJ film first embodiment 101 is provided on the underlayer structure layer 22. Also, an upper structure layer 23 is provided on the MTJ film first embodiment 101.

It is desirable for the substrate 21 to be flat and homogeneous. As the material, for example, a Si-based material such as Si, Si having a thermal oxide film (Si/SiO$_2$), SiN, SiC, etc., a compound semiconductor such as GaAs, etc., or an oxide crystal such as MgO, MgAl$_2$O$_4$, sapphire, etc., can be used.

The underlayer structure layer 22 is provided between the substrate 21 and the first magnetic layer 1, is used as an electrode layer on the lower side, and is used for controlling the magnetic properties and/or the crystal structure of the first magnetic layer. A known multilayer structure can be utilized in the underlayer structure layer 22. For example, as the electrode layer, a layer that includes at least one selected from the group consisting of Ta, TaN, Ru, Ir, Pt, W, Ti, TiN, AlTiC, Cu, CuN, Mo, Cr, Au, Ag, NiAl, NiFe, IrMn, and PtMn can be used. Also, an oxide layer of MgO, MgAl$_2$O$_4$, AlO$_x$, SiO$_x$, SrTiO$_3$, etc., may be included between the electrode layer and the substrate 21. These oxide layers can be used for controlling the crystal orientation of the electrode layer.

A magnetic layer may be included between the electrode layer and the first magnetic layer 1; for example, Co—Fe alloys, Co—Fe—Tb alloys, Mn—Ga alloys, Mn—Ge alloys, Mn—Ga—N, Fe—Pt alloys, Co—Pt alloys, etc., or a stacked film of these alloys may be used. Also, Co-based Heusler alloys that are represented by Co$_2$YZ (Y being Fe, Mn, Ti, V, Cr, etc., and Z being Al, Si, Sn, Ga, Ge, etc.) also can be used. Also, the structure may be a multilayer stack of a layer including at least one element selected from (Co or Fe) and a layer including at least one element selected from (Pt or Pd). A nonmagnetic layer of Ru, Ti, W, Mo, Ir, etc., may be inserted between the layers including these magnetic bodies. Heat treatment in a vacuum also can be performed for each of these layers.

Examples of the stacking of the underlayer structure layer 22 are, from the bottom, a Ta (5 nm)/Ru (10 nm)/NiFe (5 nm)/IrMn (10 nm)/CoFe (2.5 nm)/Ru (0.8 nm)/CoFe (2 nm) structure, a Ta (5 nm)/Ru (10 nm)/Pt (3 nm)/[Co (0.2 nm)/Pt (0.4 nm)] multilayer film/Co (0.2 nm)/Ru (0.8 nm)/[Co (0.2 nm)/Pt (0.4 nm)] multilayer film/CoFeB (1 nm)/Ta (0.2 nm) structure, and a MgO (7 nm)/Cr (40 nm)/Co$_2$FeAl (5 nm) structure. Here, the film thickness is inside ( ).

The upper structure film 23 is provided on the second magnetic layer 2. For example, the upper structure film 23 functions as an upper electrode and as a protective film of the magnetic tunnel junction film as well. For example, Ta (5 nm)/Ru (15 nm) can be used. Ta has the property of absorbing a portion of the B of Co—Fe—B during the heat treatment, and as a result of being provided directly on the Co—Fe—B, also has the effect of promoting the crystallization of the Co—Fe—B layer. Furthermore, the structure of the underlayer structure layer 22 that includes the magnetic body may be included to control the magnetic properties and/or the crystal structure of the second magnetic layer 2. For example, the structure is a Ta/CoFe/Ta/Ru structure or a W/[Co/Pd] multilayer film/Ta/Ru structure from the bottom.

Furthermore, a thin oxide layer such as MgO, etc., may be included, e.g., a Ta/Co—Fe—B/MgO/Ta/Ru structure.

Fourth Embodiment

Figure 2B:
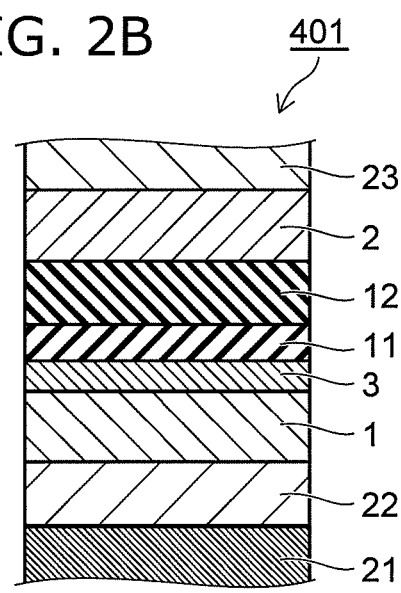

As shown typically as a MTJ film fourth embodiment 401 in FIG. 2B, a fourth embodiment is the MTJ film third embodiment 301 in which the magnetic insertion layer 3 is newly provided between the first magnetic layer 1 and the first insulating layer 11. As shown in the MTJ film second embodiment 201, the layer is a layer made of CoFe alloys and has the effect of promoting the crystallization of the first insulating layer 11 and the second insulating layer 12.

The descriptions recited above are descriptions of typical examples of embodiments of the invention and are not limited to the designated embodiments; and modifications within the spirit described in the Claims of course are possible.

The tunnel barrier of the embodiment and examples of MTJ elements using the tunnel barrier of the embodiment will now be described with reference to FIG. 3 to FIG. 8.

Example 1

An example 1 will now be described using FIG. 3A, FIG. 3B, FIG. 4A, and FIG. 4B. A Si substrate having a thermal oxide film is used as a substrate, and is introduced to a sputtering apparatus after cleaning using isopropyl alcohol. A film of Ta (5 nm)/Co—Fe—B (5 nm) is formed at room temperature using magnetron sputtering. The Ta is an underlayer structure film; and the Co—Fe—B layer is the first magnetic layer. The composition of the target used in the formation of the Co—Fe—B layer is Co$_{20}$Fe$_{60}$B$_{20}$. Then, sputtering film formation of CoFe films of 0 (no insertion layer), 0.3, 0.6, and 0.9 nm was performed as a magnetic insertion layer. The target that was used has a Co$_{75}$Fe$_{25}$ composition. Then, a film of MgO (0.25 nm) was formed as the first insulating layer by high frequency sputtering using a MgO sintering target. Continuing, a Mg—Al—O layer (10 nm) was formed by high frequency sputtering using a target having two different compositions.

For the first composition, a Mg-rich (Mg$_{0.67}$Al$_{0.33}$)—O$_x$ target was used; and the actual composition of Mg and Al of the Mg—Al—O layer was Mg$_{0.72}$Al$_{0.28}$ by using inductively coupled plasma composition analysis. Hereinafter, this composition is called Mg$_2$Al—O$_x$ for convenience.

For the second composition, an Al-rich (Mg$_{0.33}$Al$_{0.67}$)—O$_x$ target was used; and the actual composition of Mg and Al was Mg$_{0.39}$Al$_{0.61}$. Hereinafter, this composition is called MgAl$_2$—O$_x$ for convenience. Then, a film of Co$_{20}$Fe$_{60}$B$_{20}$ (5 nm) was formed as the second magnetic layer on the Mg—Al—O layer; and a film of Ta (5 nm) was formed as an upper structure film on the second magnetic layer. Subsequently, heat treatment of the multilayer film structure that was made was performed in a vacuum for 30 minutes at 300° C.

Figure 3A:
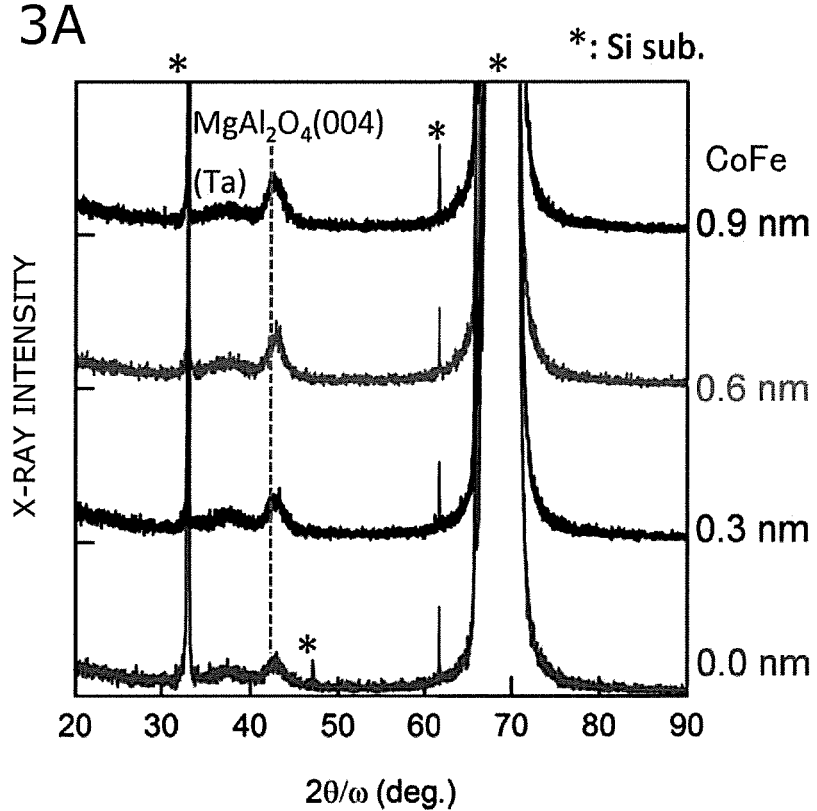
FIG. 3 shows X-ray diffraction patterns when the CoFe layer thickness is changed in a multilayer film structure of Ta/Co—Fe—B/CoFe/MgO (0.25 nm)/Mg$_2$Al—O$_x$ (10 nm)/Co—Fe—B/Ta. (A) is the film in-plane direction scan result; and (B) is the film out-of-plane direction scan result.

FIG. 3A shows X-ray diffraction patterns obtained by scanning, in the film out-of-plane direction, the multilayer film structure in the case where the Mg-rich Mg$_2$Al—O$_x$ is used. The patterns are shown separately for each CoFe insertion layer thickness. For each of the CoFe film thicknesses, a peak that corresponds to MgAl$_2$O$_4$ (004) is observed at the 42° vicinity. Other than this peak, it can be seen that there are only the peaks other than the substrate and the Ta layer. This shows that the Mg$_2$Al—O$_x$ layer is crystallized; and (001) growth is realized. It can be seen that the MgAl$_2$O$_4$ (004) peak intensity increases as the CoFe insertion thickness increases. Accordingly, this shows that the insertion of the CoFe layer promotes the crystallization of $MgAl_2O_4$.

Figure 3B:
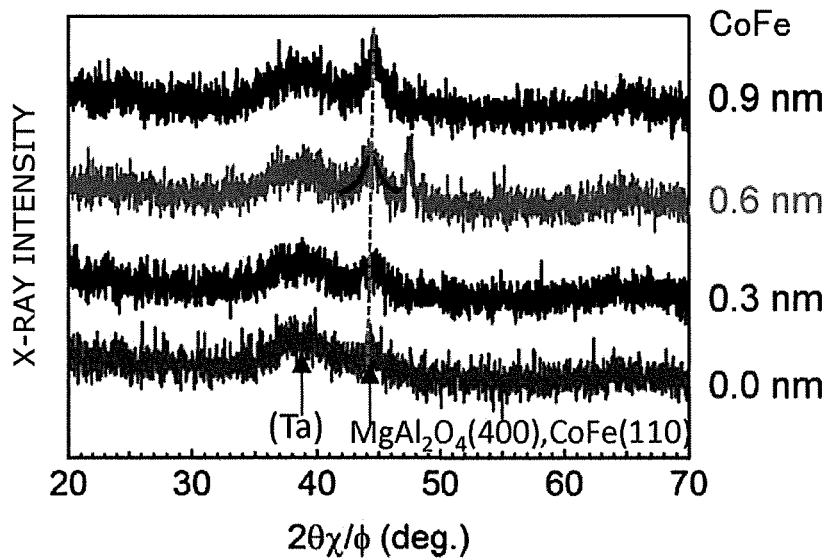

Similarly, FIG. 3B shows X-ray diffraction patterns obtained by scanning, in the film in-plane direction, the multilayer film structure of each CoFe insertion layer thickness. A peak that has $MgAl_2O_4$ (400) and CoFe (110) as the origin is observed. The intensity of this peak also increases as the CoFe insertion layer thickness increases; therefore, it can be confirmed that there is a crystallization promotion effect of $MgAl_2O_4$ due to the CoFe layer insertion. In all of the samples for which X-ray diffraction patterns were measured, an ordered spinel structure of the Mg—Al—O layer was not observed. Therefore, it can be said that the structure is a cation-disordered spinel structure having a lattice constant that is half of the original lattice constant of $MgAl_2O_4$.

The crystallization of a similar Mg—Al—O layer was confirmed from the X-ray diffraction pattern for the $MgAl_2$—$O_x$ composition as well. The crystal lattice spacing in the film surface and in the film out-of-plane direction of the formed Mg—Al—O was estimated from the observed X-ray peak positions, the $MgAl_2O_4$ (004) and (400).

Figure 4A:
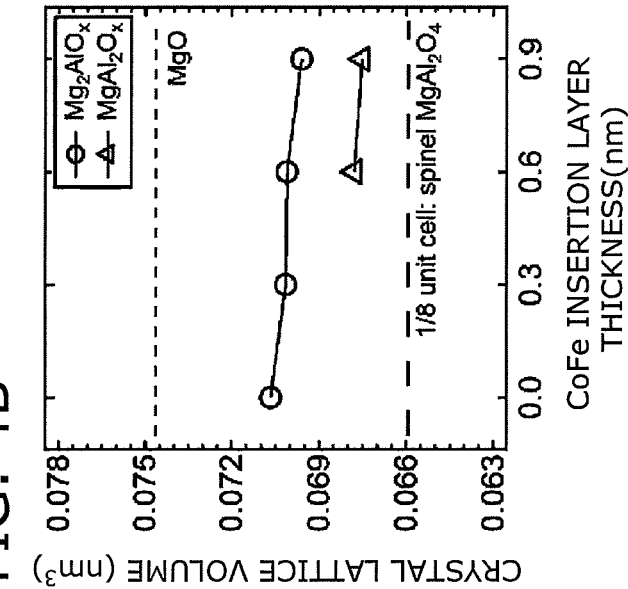
FIG. 4 is a figure showing the relationship of a CoFe insertion layer thickness with (A) the crystal lattice spacing and (B) the crystal lattice volume determined from X-ray diffraction patterns for each of Mg$_2$Al—O$_x$ and MgAl$_2$—O$_x$ as the Mg—Al—O layer in a multilayer film structure of Ta/Co—Fe—B/CoFe/MgO (0.25 nm)/Mg—Al—O (10 nm)/Co—Fe—B/Ta.

FIG. 4A shows the relationship of the crystal lattice spacing with the CoFe insertion layer thickness for each of $Mg_2Al$—$O_x$ and $MgAl_2$—$O_x$. From this figure, it can be seen that the lattice spacing substantially does not affect the CoFe film thickness for each of the compositions. Also, it can be seen that the lattice spacing in the film in-plane direction is smaller than the spacing in the film out-of-plane direction. The in-plane lattice spacing is in the range of 0.405 to 0.408 nm for each of the compositions. These values are near the $MgAl_2O_4$ bulk value (0.4045 nm) and suggest that the crystal extends in the film out-of-plane direction (tetragonal distortion is introduced) so that good in-plane lattice matching with the Co—Fe—B layer is realized. Furthermore, it can be seen that the lattice constant in the film out-of-plane direction is different according to the Mg—Al composition.

Figure 4B:
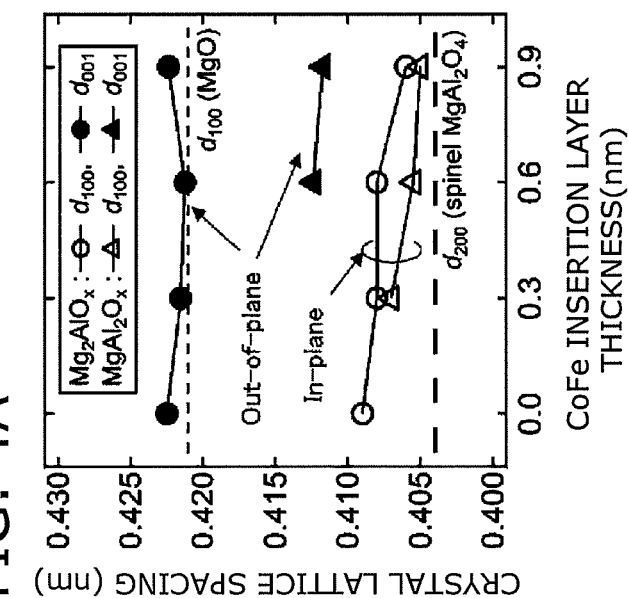

The crystal lattice volume is calculated in FIG. 4B. $MgAl_2$—$O_x$ has a value near the bulk value (⅛ unit cell) of $MgAl_2O_4$ converted to a value when the lattice constant is considered to be half. On the other hand, it can be seen that $Mg_2Al$—$O_x$ has a value near the average value of the MgO bulk value and the $MgAl_2O_4$ bulk converted value. Accordingly, this also suggests that continuous control of the crystal lattice volume is possible by adjusting the Mg—Al composition. It can also be seen that even for the Mg-rich composition which originally has lattice mismatch, in-plane lattice matching is realized by easily introducing tetragonal distortion. Thus, it was confirmed that the Mg—Al—O layer is crystallized by inserting extremely thin MgO between the Mg—Al—O layer and the Co—Fe—B layer; and the crystallinity is improved further by the CoFe layer insertion. Also, it was also found that an in-plane lattice matching state with the Co—Fe—B layer can be realized for a wide range of compositions of Mg—Al.

Example 2

An example 2 will now be described using FIG. 5A, FIG. 5B, FIG. 6A, and FIG. 6. Using a method equivalent to that of the example 1, an underlayer structure film of Ta (5 nm)/Ru (10 nm)/Ta (5 nm) was made on a Si substrate having a thermal oxide film. Then, after forming the first magnetic layer of $Co_{20}Fe_{60}B_{20}$ (5 nm), sputtering film formation of a $Co_{75}Fe_{25}$ film was performed as a magnetic insertion layer. The film thickness of the $Co_{75}Fe_{25}$ layer was changed in the range of 0.1 to 1.0 nm. Then, a MgO layer was formed as the first insulating layer by changing the film thickness to be 0.1 to 0.8 nm. Continuing, high frequency sputtering film formation of $Mg_2Al$—$O_x$ or $MgAl_2$—$O_x$ having a thickness of 1.2 nm was performed as the second insulating layer. Subsequently, a film of $Co_{20}Fe_{60}B_{20}$ (3 nm)/Ta (5 nm)/Ru (5 nm) was formed. After making the multilayer film, the MTJ element structure was formed by performing fine patterning into an elliptical shape having a size of 400 nm×200 nm by using electron beam lithography, photolithography, and an ion etching apparatus. Also, Au was used as a measurement electrode. Subsequently, heat treatment of the MTJ element was performed in a vacuum for 30 minutes at 400° C. Then, the change of the electrical resistance of the MTJ element was measured at room temperature for an external magnetic field and a bias voltage by a DC four-terminal technique. The TMR ratio (%) was defined as $100 \times (R_{AP} - R_P)/R_P$, wherein the resistance value when the magnetic ordering of the magnetic layers above and below is antiparallel is $R_{AP}$, and the resistance value when the magnetic ordering of the magnetic layers above and below is parallel is $R_P$.

Figure 5A:
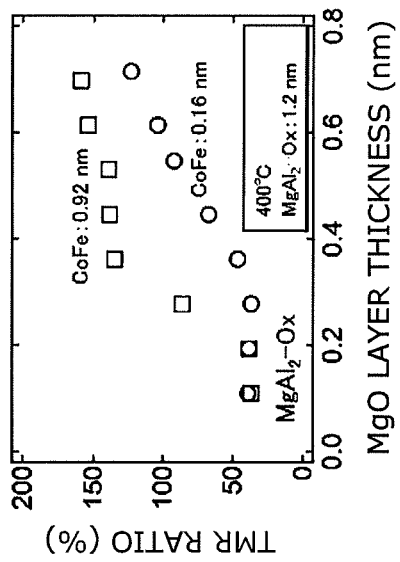
FIG. 5 shows the relationship between the MgO layer thickness and the TMR ratio of a MTJ element made with a CoFe film thickness of 0.16 nm and 0.92 nm. (A) is the result using Mg$_2$Al—O$_x$; and (B) is the result using MgAl$_2$—O$_x$.

FIG. 5A shows the relationship between the TMR ratio and the MgO layer thickness in the case where $Mg_2Al$—$O_x$ is used and the CoFe film thickness=0.16 nm and 0.92 nm is fixed. In the example, a maximum TMR ratio of about 200% is obtained. This is a high value that cannot be expected to be realized by an amorphous barrier layer, and shows that the coherent tunneling effect arises markedly due to the crystallization of the Mg—Al—O layer and a high-quality (001) orientation film being achieved. It can be seen that the TMR ratio improves as the MgO insertion layer thickness increases; and finally, there is a trend of saturating. In particular, in the case where a thick CoFe layer thickness of 0.92 nm is used, a sufficient effect is realized if MgO is about 0.15 nm. Also, even in a thin MgO region of 0.05 nm, a relatively high value of about 130% is realized. On the other hand, in the case of a thin CoFe layer of 0.16 nm, it can be seen that the TMR ratio is low as an entirety; and a relatively thick MgO layer insertion is necessary to obtain a high TMR ratio. Accordingly, it can be seen that the CoFe insertion layer thickness also greatly affects the crystallization of the Mg—Al—O layer.

Figure 5B:
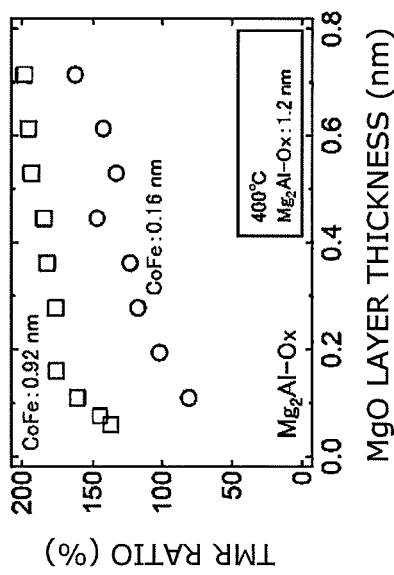

FIG. 5B shows the result in the case where $MgAl_2$—$O_x$ is used. A maximum TMR ratio of about 160% is realized. However, to obtain a TMR ratio exceeding 100%, MgO insertion of about 0.3 nm which is thicker than that of the $Mg_2Al$—$O_x$ composition is necessary. It is considered that this is because a stronger template effect was necessary to crystallize the Mg—Al—O layer because a composition having more Al was used.

Figure 6A:
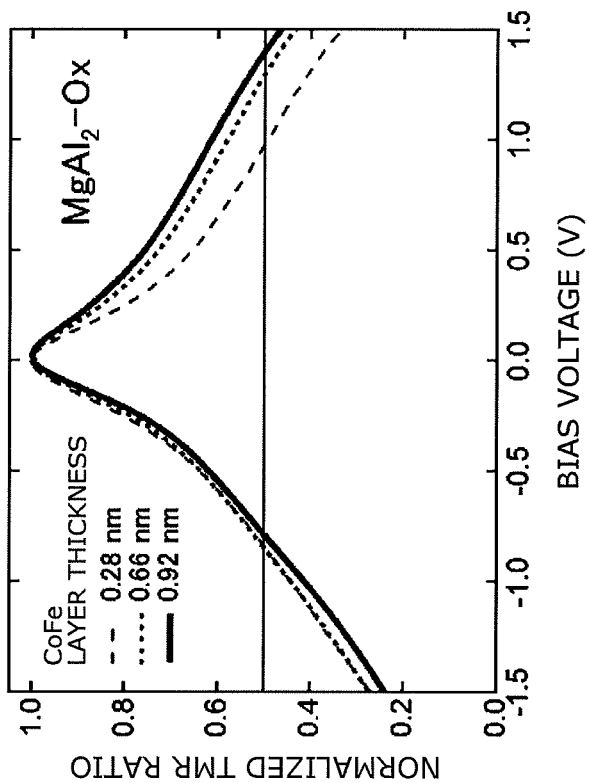
FIG. 6 is a figure showing the bias voltage dependence of the TMR ratio normalized using the value of zero voltage. (A) is the result using Mg$_2$Al—O$_x$; and (B) is the result using MgAl$_2$—O$_x$.
Figure 6B:
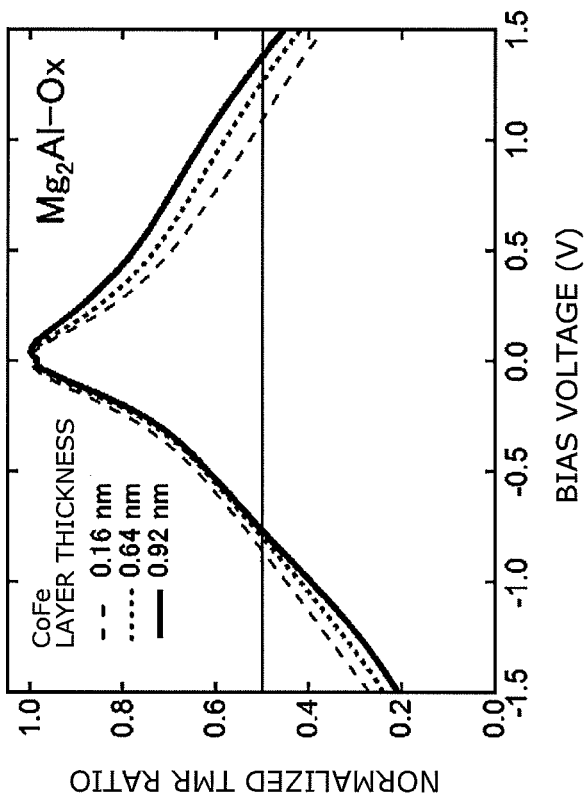

Then, the bias voltage dependence of the TMR ratio normalized with the value of a zero-bias voltage is shown respectively in FIG. 6A for the results of the $Mg_2Al$—$O_x$ composition and in FIG. 6B for the results of the $MgAl_2$—$O_x$ composition. These figures respectively show results for different CoFe insertion layer film thicknesses in which the MgO thickness is fixed at 0.45 nm. Also, the direction from the lower layer toward the upper layer was defined as the positive voltage direction in which the electrons tunnel. Substantially equivalent behavior can be seen in these figures for each Mg—Al composition. In other words, it can be seen that the bias voltage dependence of the TMR ratio is small in the positive voltage direction. In particular, the dependence decreases as the CoFe layer thickness increases. On the other hand, the CoFe film thickness dependence is small in the negative voltage direction.

The bias voltage at which the normalized TMR=0.5 means $V_{half}$ and is a simple indicator of the bias voltage dependence. The positive voltage direction ($V_{half+}$) has an extremely large value of about 1.4 V when the CoFe layer insertion thickness is 0.92 nm for both Mg—Al compositions. This strongly reflects the state of the upper barrier interface in the positive voltage direction; and it is considered that the high $V_{half+}$ is caused by the few lattice mismatch defects at the interface where the Mg—Al—O layer and the upper Co—Fe—B layer contact.

The negative current direction ($V_{half-}$) is about 0.8 V for each condition, and is smaller than that of the positive voltage direction. As possibilities thereof, the effects of the lattice mismatch remaining at the interface between the CoFe insertion layer and the MgO layer and/or damage due to over-oxidization, etc., are considered. Also, generally, $V_{half}$ is greatly affected by the magnetic layer composition, and when Co-Fe—(B)-based, decreases as the Co composition increases. Accordingly, it can be said that the Co-rich composition of $Co_{75}Fe_{25}$ used in the insertion layer also causes $V_{half-}$ to decrease.

Example 3

Figure 7:
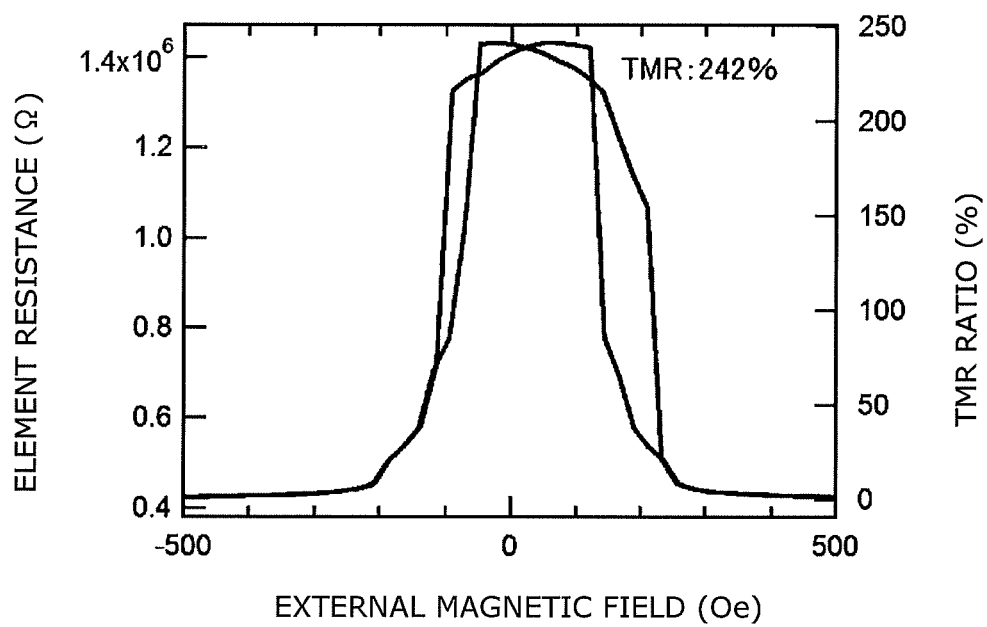
FIG. 7 is a figure of the measurement of the external magnetic field dependence of the TMR ratio and the electrical resistance of a MTJ element using Mg$_2$Al—O$_x$ on which heat treatment is performed at 500° C.

An example 3 will now be described using FIG. 7. Using a method equivalent to that of the example 2, a film of Ta (5 nm)/Ru (10 nm)/Ta (5 nm)/$Co_{20}Fe_{60}B_{20}$ (5 nm)/$Co_{75}Fe_{25}$ (1.0 nm)/MgO (0.4 nm)/Mg-rich composition $Mg_2Al$—$O_x$ (1.2 nm)/$Co_{20}Fe_{60}B_{20}$ (3 nm)/Ta (5 nm)/Ru (5 nm) was formed on a Si substrate having a thermal oxide film; and fine patterning was performed. Subsequently, heat treatment was performed in a vacuum for 30 minutes at 500° C. The measurement results of the external magnetic field dependence of the element resistance and the TMR ratio are shown in FIG. 7. It can be seen from the figure that the TMR ratio=242% was obtained; and this value that was obtained is a value that is higher than the maximum value (about 200%) for heat treatment at 400° C. This is because the crystallization of each layer progressed effectively by performing the heat treatment at a higher temperature.

Example 4

Figure 8A:
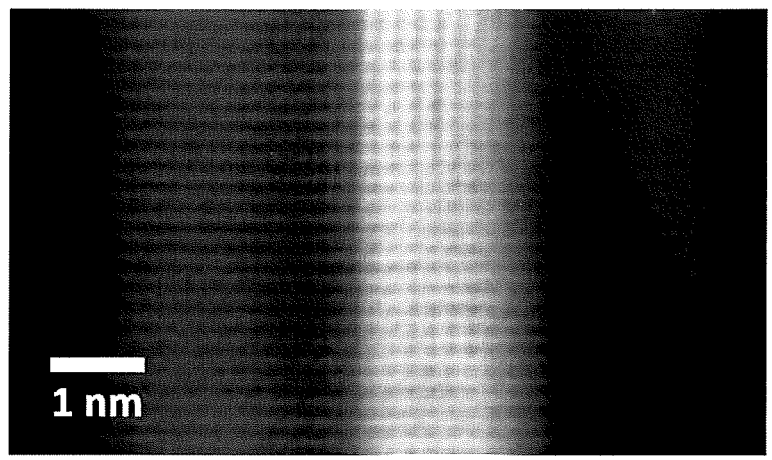
FIG. 8A shows a cross-sectional electron microscope image (a STEM image) of an element having a MgO (0.7 nm)/MgAl$_2$—O$_x$ (1.2 nm) stacked barrier layer on which heat treatment is performed at 500° C.
Figure 8B:
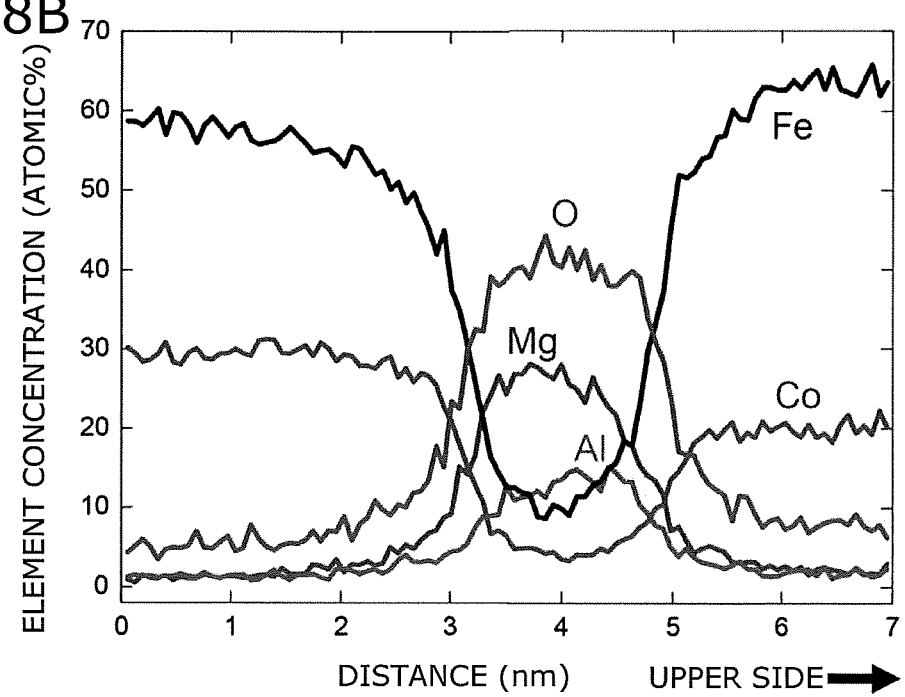
FIG. 8B shows the elemental analysis results using energy dispersive X-ray spectroscopy (EDS).

An example 4 will now be described using FIGS. 8A and 8B. Using a method equivalent to that of the examples 2 and 3, a film of Ta (5 nm)/Ru (10 nm)/Ta (5 nm)/$Co_{20}Fe_{60}B_{20}$ (5 nm)/$Co_{75}Fe_{25}$ (1.0 nm)/MgO (0.7 nm)/Al-rich composition $MgAl_2$—$O_x$ (1.2 nm)/$Co_{20}Fe_{60}B_{20}$ (3 nm)/Ta (5 nm)/Ru (5 nm) was formed on a Si substrate having a thermal oxide film; subsequently, heat treatment was performed in a vacuum for 30 minutes at 500° C. The TMR ratio of this multilayer film sample was 220%. A cross-sectional electron microscope image (the STEM image) of the multilayer film is shown in FIG. 8A; and the results of the composition profile of each element of Mg, Al, O, Fe, and Co using energy dispersive X-ray spectroscopy (EDS) is shown in FIG. 8B.

From the cross-sectional STEM image, it can be seen that the upper and lower magnetic layers and the stacked barrier layer are crystallized. Also, it was found that all of these layers have (001) growth. Also, it can also be seen that no distinct boundary inside the MgO/$MgAl_2$—$O_x$ stacked barrier layer is observed; and the appearance is that of one body. From the EDS element profile as well, Mg and Al have mutual diffusion inside the MgO/$MgAl_2$—$O_x$ stacked barrier layer and have a substantially uniform Mg—Al concentration; and a crystallized Mg—Al—O barrier is realized between the upper and lower magnetic layers. The interfaces with the Co—Fe—(B) layers are exceedingly smooth; and because substantially no in-plane lattice mismatch is observed, it can be seen that a high-quality lattice matching interface is realized. Also, it can also be seen that the barrier layer has a composition in which Mg is richer than Al because a relatively thick MgO insertion layer is used.

Accordingly, according to the structure and the manufacturing method of the embodiment, a high-quality Mg—Al—O crystal layer can be achieved; and a MTJ element that has both a high TMR ratio and a high $V_{half}$ can be configured. This shows that a high performance MTJ element suited to various applications can be provided in which a high element voltage output can be realized.

Figure 9:
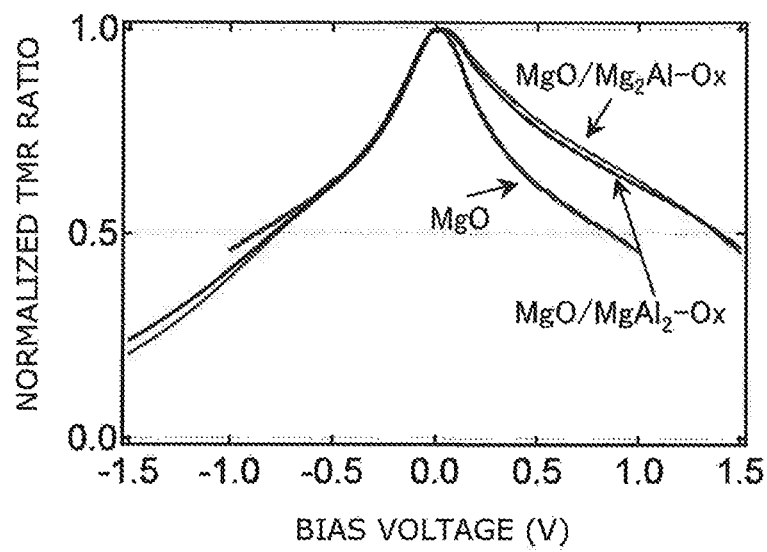
FIG. 9 is a figure showing the bias voltage dependence for a MTJ element having a MgO single barrier layer and a MTJ element having a MgO/Mg—Al—O stacked barrier layer.
Figure 10:
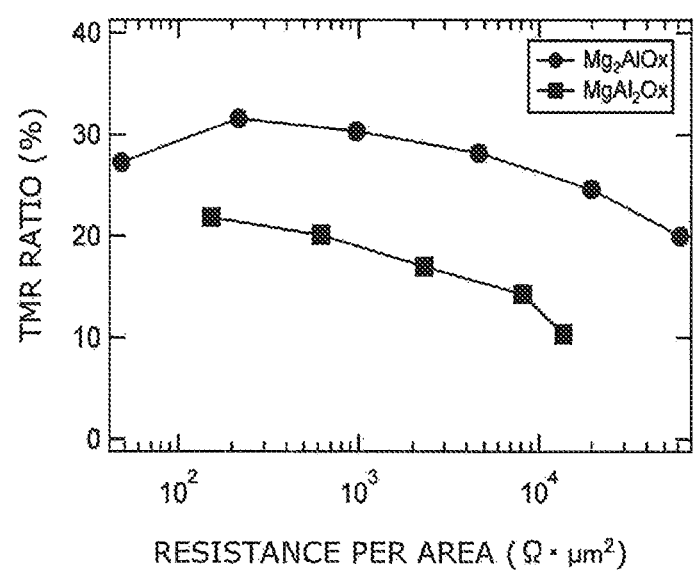
FIG. 10 is a figure showing the relationship of the TMR ratio and the resistance area (RA) of a MTJ film having a Co—Fe—B/Mg—Al—O/Co—Fe—B structure (after heat treatment at 300° C.).

A comparative example for the MTJ element of the embodiment will now be described with reference to FIG. 9 and FIG. 10.

Comparative Example 1

As a comparative example 1, the results of measuring the bias voltage dependence of a MgO single barrier that does not have a $MgAl_2O_4$ layer will now be described using FIG. 9. Using a method equivalent to that of the examples 2 to 4, a film of Ta (5 nm)/Ru (10 nm)/Ta (5 nm)/$Co_{20}Fe_{60}B_{20}$ (5 nm)/MgO (about 1.4 nm)/$Co_{20}Fe_{60}B_{20}$ (3 nm)/Ta (5 nm)/Ru (5 nm) was formed on a Si substrate having a thermal oxide film; subsequently, fine patterning was performed; and heat treatment was performed in a vacuum for 30 minutes at 400° C. The TMR ratio at a zero-bias voltage was 250%. FIG. 9 shows the bias voltage dependence of the normalized TMR ratio of the MTJ sample. For comparison, samples using MgO (0.45 nm)/$MgAl_2$—$O_x$ (1.2 nm) and MgO (0.45 nm)/$Mg_2Al$—$O_x$ (1.2 nm) also are shown (both using a CoFe insertion layer of 0.9 nm). It can be seen clearly in FIG. 9 that in the positive voltage direction, $V_{half}$ of the MgO single barrier is small compared to that of the barrier using Mg—Al—O.

Comparative Example 2

As a comparative example 2, the results of measuring the TMR ratio of a Mg—Al—O single barrier will now be described using FIG. 10. Using a method equivalent to that of the examples 1 to 3, a film of Ta (5 nm)/Ru (20 nm)/$Ir_{20}Mn_{80}$ (5 nm)/$Co_{75}Fe_{25}$ (2.5 nm)/Ru (1.1 nm)/$Co_{20}Fe_{60}B_{20}$ (5 nm)/Mg—Al—O (0.8-1.2 nm)/$Co_{20}Fe_{60}B_{20}$ (3 nm)/Ta (5 nm)/Ru (8 nm) was formed on a Si substrate having a thermal oxide film; subsequently, heat treatment was performed in a magnetic field of 5 kOe in a vacuum for 30 minutes at 300° C. Both $Mg_2Al$—$O_x$ and $MgAl_2$—$O_x$ were used as Mg—Al—O. FIG. 10 shows the relationship of the TMR ratio and the RA of the MTJ film sample that was made. The TMR ratio was a small value of about 10 to 30% regardless of the magnitude of RA for the samples of each composition. Accordingly, this shows that the coherent tunneling effect does not act effectively in the case where the MgO insertion layer is not used because the crystallization of the Mg—Al—O layer is insufficient.

Effects of Invention

According to the MTJ element of the invention, by providing an extremely thin template layer having MgO as a major body in the lower portion of the Mg—Al—O layer, even when amorphous Co—Fe—B is used as the magnetic layer, a conventionally unachievable high TMR ratio can be utilized at room temperature; and it is possible to simultaneously achieve a good bias voltage dependence. Being able to use an amorphous magnetic layer with the Mg—Al—O barrier layer means that it is possible to include a barrier layer having good lattice matching in the MTJ element without limiting the types of substrates and/or underlayer structures. Accordingly, utilization is anticipated in various applications utilizing MTJ elements.

According to the MTJ element of the invention, by using non-deliquescent Mg—Al—O as the barrier layer, it is possible for the damage due to the wet processes used when making fine elements, etc., to be a minimum. Additionally, because a lattice matching barrier interface is obtained, the achievement of a MTJ element having high reliability also can be expected.

<Examples of Devices in which MTJ Film of Invention is Mounted>

Figure 11:
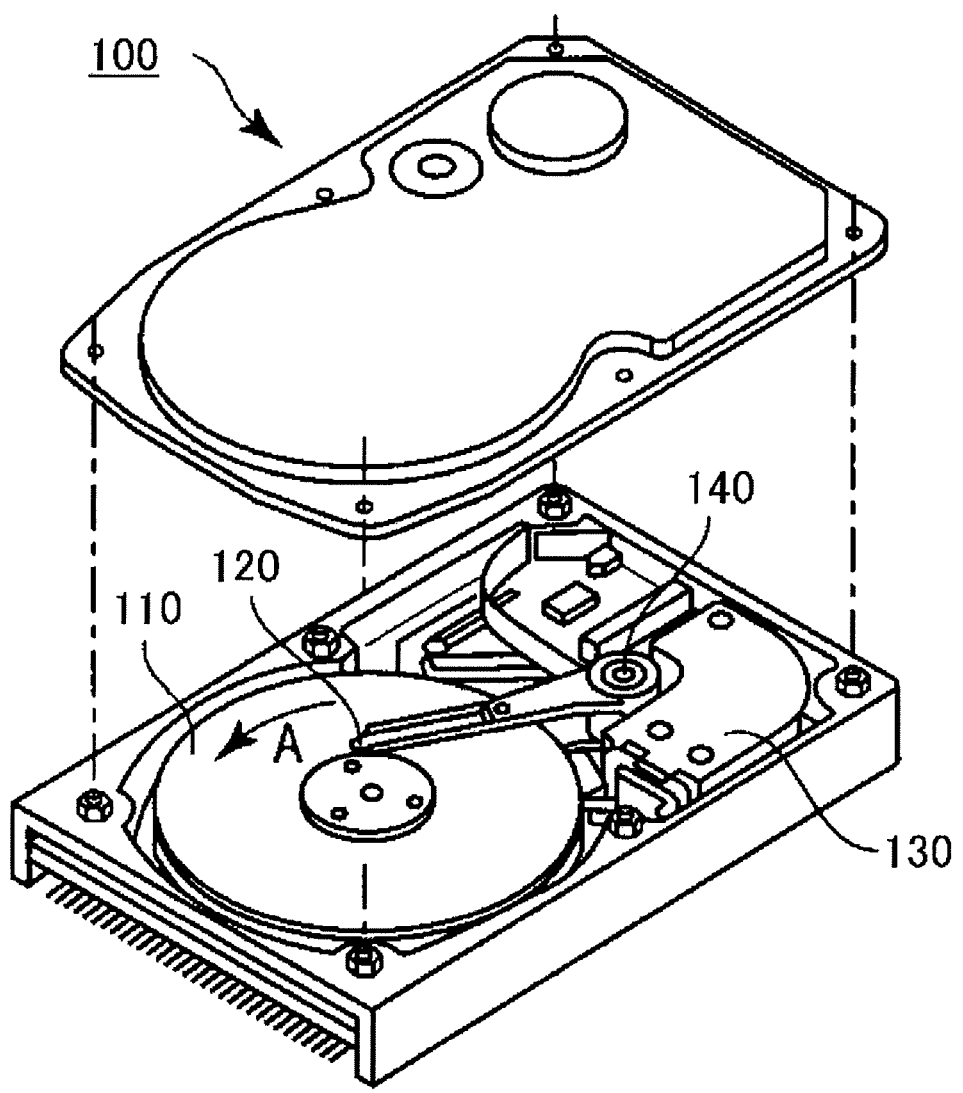
FIG. 11 is a schematic view showing an example of a magnetic recording and reproducing device in which the MTJ element of the invention is mounted.

FIG. 11 is a main component perspective view illustrating a schematic configuration of a magnetic recording and reproducing device in which a magnetic head, in which the MTJ film of the invention is mounted, can be mounted. In FIG. 11, the magnetic recording and reproducing device 100 is a type of device in which a rotary actuator is used. In this drawing, a recording medium disk 110 is mounted to a spindle 140 and is rotated in the direction of arrow A by a not-illustrated motor responding to a control signal from a not-illustrated drive device controller. The magnetic recording and reproducing device 100 may include multiple medium disks 110.

A head slider 120 that performs the recording and reproducing of information stored in the medium disk 110 is mounted to the tip of a suspension 152 having a thin-film configuration. Here, for example, the head slider 120 has the magnetic head according to the embodiment mounted at the tip vicinity of the head slider 120.

When the medium disk 110 rotates, the medium-opposing surface (the ABS) of the head slider 120 is held at a prescribed fly height from the surface of the medium disk 110. Or, the slider may be so-called "contact-sliding" in contact with the medium disk 110.

The suspension 152 is connected to one end of an actuator arm 154 including a bobbin part (not illustrated) holding a drive coil, etc. A voice coil motor 130 which is one type of linear motor is provided at the other end of the actuator arm 154. The voice coil motor 130 includes a drive coil (not illustrated) wound onto the bobbin part of the actuator arm 154 and a magnetic circuit (not illustrated) made of a permanent magnet and an opposing yoke arranged to oppose each other with the coil interposed.

The actuator arm 154 is held by ball bearings (not illustrated) provided in the spindle 140 and can be caused to rotate and slide unrestrictedly by the voice coil motor 130.

Figure 12:
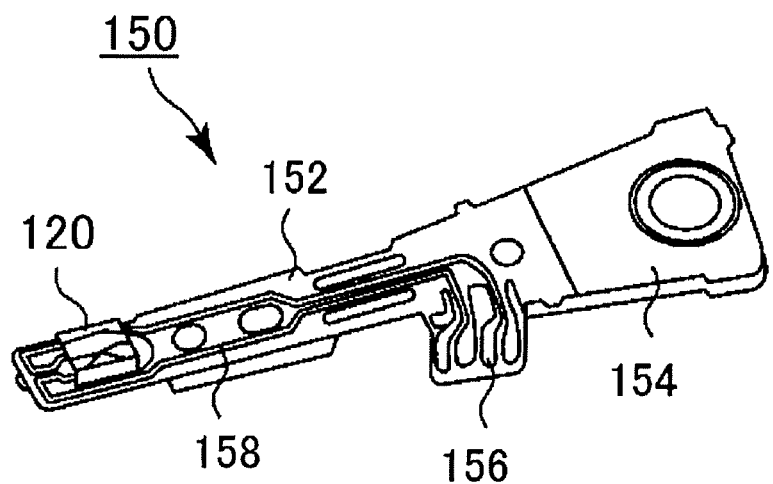
FIG. 12 is a schematic view showing an example of a magnetic head assembly in which the MTJ element of the invention is mounted.

FIG. 12 is an enlarged perspective view of the magnetic head assembly from the actuator arm 154 tipward viewed from the disk side. In other words, the magnetic head assembly 150 includes, for example, the actuator arm 154 including the bobbin part holding the drive coil, etc.; and the suspension 152 is connected to one end of the actuator arm 154.

Figure 13:
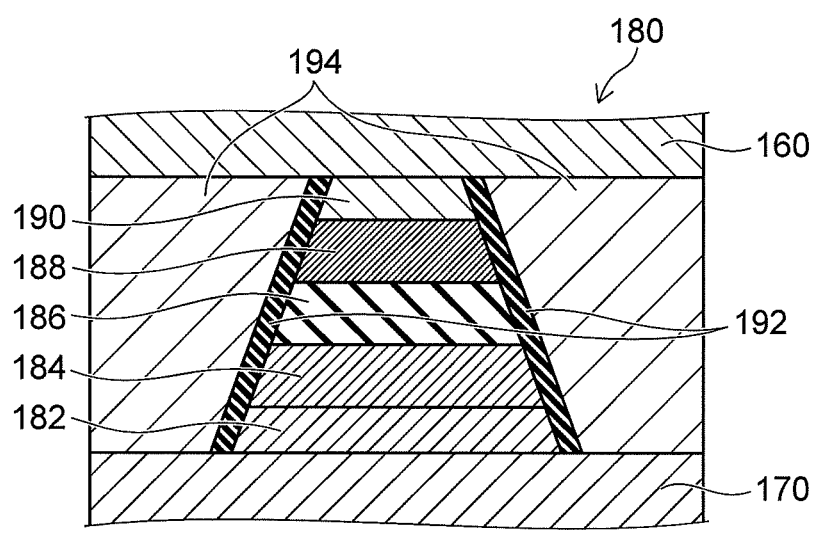
FIG. 13 is a configuration diagram schematically showing the cross section of a magnetic head reproducing sensor in which the MTJ element of the invention is mounted.

The head slider 120 that includes the magnetic head shown in FIG. 13 is mounted to the tip of the suspension 152. The suspension 152 includes lead wires 158 for writing and reproducing the signals; and the lead wires 158 and electrodes of the magnetic head included in the head slider 120 are electrically connected. 156 in the drawing is an electrode pad of the magnetic head assembly 150.

FIG. 13 is a configuration diagram schematically showing a cross section of the magnetic head reproducing sensor. As shown in FIG. 13, a reproducing sensor 180 is provided between an upper magnetic shield 160 and a lower magnetic shield 170. The reproducing sensor 180 is configured by stacking, in order from the lower magnetic shield 170 side toward the upper magnetic shield 160 side, an underlayer layer 182 made of a nonmagnetic conductive layer, a first magnetic layer 184, an intermediate layer 186 (a nonmagnetic insulating layer), a second magnetic layer 188, and a capping layer 190 made of a nonmagnetic conductive layer. Although stacked in the order of the first magnetic layer 184, the intermediate layer 186, and the second magnetic layer 188, these layers may be stacked in the order of the second magnetic layer, the intermediate layer, and the first magnetic layer. The reproducing sensor 180 is provided, with an insulating layer 192 interposed, between magnetic domain control films 194 on the left and right that are made of permanent magnet materials.

The MTJ film first embodiment 101 to the fourth embodiment 401 described above can be utilized in the stacked structure from the underlayer layer 182 to the capping layer 190. For example, the underlayer layer 182 corresponds to the underlayer structure layer 22; the first magnetic layer 184 corresponds to the first magnetic layer 1; the intermediate layer 186 corresponds to the stacked film made of the first insulating layer 11 and the second insulating layer 12; the second magnetic layer 188 corresponds to the second magnetic layer 2; and the capping layer 190 corresponds to the upper structure layer 23. It is desirable for the layer thickness of the intermediate layer 186 to be from 0.6 to 3 nm including the first insulating layer 11 and the second insulating layer 12. Thereby, it is possible to adjust the exchange coupling between the first magnetic layer 184 and the second magnetic layer 188 and the resistance value of the intermediate layer 186 to optimal values.

INDUSTRIAL APPLICABILITY

According to the MTJ element of the invention, the MTJ element can be utilized in a nonvolatile random access magnetic memory MRAM using the MTJ element as a memory cell.

Also, the MTJ element of the invention can be utilized in the magnetic head of a magnetic recording and reproducing device, and in a large-capacity magnetic logic circuit. Furthermore, utilization also is possible in a micro-size highly-sensitive sensor and/or spin torque oscillator.

REFERENCE NUMERAL LIST 1 first magnetic layer
2 second magnetic layer
3 magnetic insertion layer
11 first insulating layer
12 second insulating layer
21 substrate
22 underlayer structure layer
23 upper structure layer
101 MTJ film first embodiment
201 MTJ film second embodiment
301 MTJ film third embodiment
401 MTJ film fourth embodiment

The invention claimed is:

1. A magnetic tunnel junction, comprising:
 a tunnel barrier layer provided between a first magnetic layer and a second magnetic layer, wherein the tunnel barrier layer is a crystal body made of a stacked structure of a first insulating layer and a second insulating layer, the crystal body is oriented, the first insulating layer is made of an oxide of $Mg_{1-x}X_x$ ($0 \leq x \leq 0.15$), wherein X is at least one element selected from the group consisting of Al and Ti, a thickness of the first insulating layer is not less than 0.05 nm and not more than 1.2 nm, the second insulating layer is crystalline and made of an oxide of an alloy comprising at least two elements selected from the group consisting of Mg, Al, Zn, and Li, a sum of the thickness of the first insulating layer and a thickness of the second insulating layer is not less than 0.6 nm and not more than 3 nm, and both the first magnetic layer and the second magnetic layer are made of an alloy comprising B and at least one element selected from the group consisting of Co and Fe.

2. The magnetic tunnel junction according to claim 1, further comprising:

a layer comprising at least one element selected from the group consisting of Co and Fe at both or one of between the tunnel barrier layer and the first magnetic layer or between the tunnel barrier layer and the second magnetic layer.

3. The magnetic tunnel junction according to claim 1, wherein the first insulating layer is made of MgO.

4. The magnetic tunnel junction according to claim 1, wherein the second insulating layer is made of an oxide of $Mg_{1-y}Al_y$ ($0.2 \leq y \leq 0.8$).

5. The magnetic tunnel junction according to claim 1, having a tunnel magneto-resistance not less than 120% and not more than 34000% at room temperature.

6. A spintronics device, comprising the magnetic tunnel junction according to claim 1.

7. The spintronics device according to claim 6, wherein the spintronics device is one of a hard disk magnetic head, a spin torque rewritable MRAM, a three-terminal MRAM, a voltage-driven MRAM, a spin torque oscillator, or a spin resonance tunnel element.

8. The magnetic tunnel junction according to claim 1, wherein the first insulating layer and the second insulating layer are (001) grown orientation films.

9. A method for manufacturing a magnetic tunnel junction according to claim 1, the method comprising:
  i) introducing a substrate to a sputtering apparatus;
  ii) forming a first magnetic layer at the substrate;
  iii) forming a first insulating layer to overlap the first magnetic layer, a thickness of the first insulating, layer being not less than 0.05 nm and not more than 1.2 nm;
  iv) forming a second insulating layer to overlap the first insulating layer, a sum of the thickness of the first insulating layer and a thickness of the second insulating layer being not less than 0.6 nm and not more than 3 nm;
  v) forming a second magnetic layer to overlap the second insulating layer; and
  vi) performing heat treatment of a multilayer film structure that is made,
  wherein the heat treatment is performed in a vacuum for 1 minute to 60 minutes at a temperature range from 300° C. to 500° C., and
  after the heat treatment, the second insulating layer is crystalline.

10. The method according to claim 9, wherein the forming ii) is performed after forming Ta at the substrate, and the Ta is an underlayer structure film.

11. The method according to claim 9, further comprising:
  ii-a) forming a first magnetic insertion layer to overlap the first magnetic layer between the forming ii) and the forming iii).

12. The method according to claim 9, further comprising:
  iv-a) forming a second magnetic insertion layer to overlap the second insulating layer between the forming iv) and the forming v).

13. The method according to claim 9, further comprising:
  forming Ta as an upper structure film to overlap the second magnetic layer between the forming v) and the forming vi).

14. The method according t claim 9, wherein after the heat treatment, the first insulating layer and the second insulating layer are (001) grown orientation films.

* * * * *